(12) United States Patent
Doussiere et al.

(10) Patent No.: US 11,217,964 B2
(45) Date of Patent: Jan. 4, 2022

(54) CURRENT CHANNEL FOR III-V SILICON HYBRID LASER

(71) Applicant: Intel Corporation, Santa Clara, CA (US)

(72) Inventors: Pierre Doussiere, San Jose, CA (US); George A. Ghiurcan, Corrales, NM (US); Jonathan K. Doylend, Morgan Hill, CA (US); Harel Frish, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 146 days.

(21) Appl. No.: 16/236,211

(22) Filed: Dec. 28, 2018

(65) Prior Publication Data

US 2019/0157837 A1 May 23, 2019

(51) Int. Cl.
| | |
|---|---|
| *H01S 5/02* | (2006.01) |
| *H01S 5/065* | (2006.01) |
| *H04J 14/02* | (2006.01) |
| *H04B 10/25* | (2013.01) |
| *H01S 5/40* | (2006.01) |
| *G02B 6/122* | (2006.01) |
| *H01S 5/0683* | (2006.01) |

(Continued)

(52) U.S. Cl.
CPC ............ *H01S 5/0657* (2013.01); *G02B 6/122* (2013.01); *H01S 5/021* (2013.01); *H01S 5/0683* (2013.01); *H01S 5/4087* (2013.01); *H04B 10/25* (2013.01); *H04B 10/505* (2013.01); *H04J 14/0278* (2013.01); *G02B 6/4204* (2013.01); *G02B 2006/12121* (2013.01); *G02B 2006/12142* (2013.01); *G02B 2006/12159* (2013.01); *G02B 2006/12164* (2013.01)

(58) Field of Classification Search
CPC .... H01S 5/0657; H01S 5/4087; H01S 5/0683; H01S 5/2063; H01S 5/021; H01S 5/0085; H01S 5/4012; H04B 10/505; H04B 10/25; H04J 14/0278; G02B 6/122; G02B 2006/12164; G02B 2006/12121; G02B 2006/12142; G02B 2006/12159; G02B 6/4204
See application file for complete search history.

(56) References Cited

U.S. PATENT DOCUMENTS

| | | | | |
|---|---|---|---|---|
| 4,792,960 A | * | 12/1988 | Yamamoto | ................ H01S 5/24 372/45.01 |
| 5,343,324 A | * | 8/1994 | Le | .......................... G02F 1/0123 398/198 |

(Continued)

*Primary Examiner* — Xinning (Tom) Niu
(74) *Attorney, Agent, or Firm* — Patent Capital Group

(57) ABSTRACT

There is disclosed in one example a fiberoptic communication device, including: a modulator to modulate data onto a laser pulse; and a semiconductor laser source including an active optical waveguide to provide optical gain and support an optical mode, the laser source further including a V-shaped current channel superimposed on the optical waveguide, and disposed to feed the active optical waveguide with electrical current along its length, the current channel having a proximate end to the optical mode, the proximate end having a width substantially matching a diameter of the optical mode, and a removed end from the optical mode, wherein the removed end is substantially wider than the proximate end.

18 Claims, 11 Drawing Sheets

(51) Int. Cl.
*H04B 10/50* (2013.01)
*G02B 6/42* (2006.01)
*G02B 6/12* (2006.01)

(56) References Cited

U.S. PATENT DOCUMENTS 10,008,828 B1* 6/2018 Doussiere ........... H01S 5/04254
2017/0098917 A1* 4/2017 Popovic ................. H04J 14/02

* cited by examiner

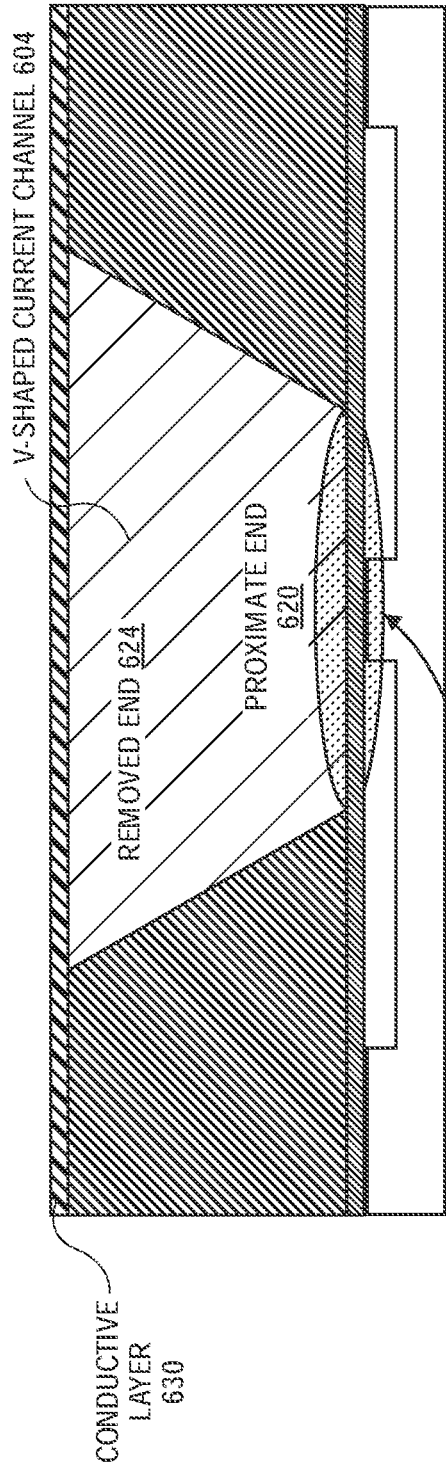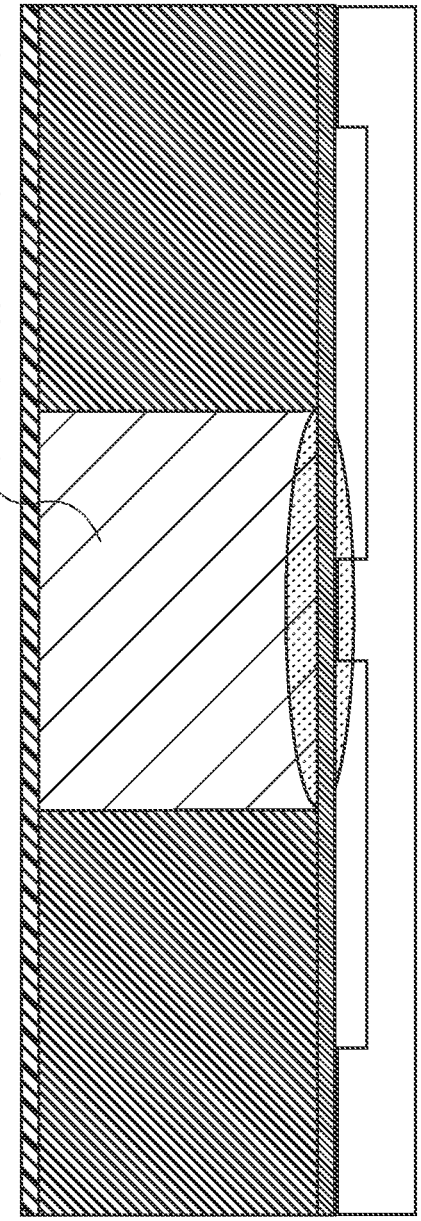

CURRENT CHANNEL FOR III-V SILICON HYBRID LASER

FIELD OF THE SPECIFICATION

This disclosure relates in general to the field of silicon photonics and more particularly, though not exclusively, to a system for providing a current channel for a III-V silicon hybrid laser.

BACKGROUND

Wavelength division multiplexing (WDM) is a communication technique of multiplexing a plurality of optical carrier signals onto a single optical fiber. A plurality of wavelengths of laser light are multiplexed onto the single optical fiber, thus providing discrete communication over a plurality of channels on the single optical fiber.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

FIG. 6 illustrates a V-shaped current channel.

FIG. 7 illustrates a straight current channel.

EMBODIMENTS OF THE DISCLOSURE

Figure 1:
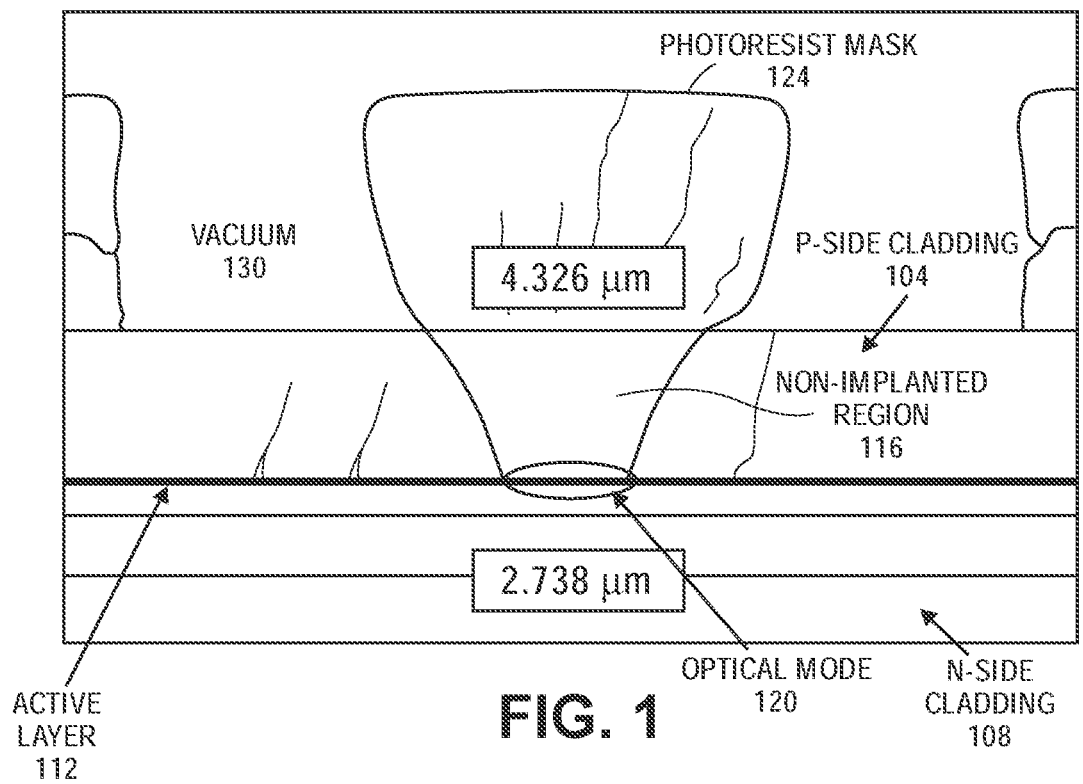
FIG. 1 is a cutaway illustration of the manufacture of a V-shaped current channel.

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different figures. This repetition is for the purpose of simplicity and clarity and does not in itself dictate a specific relationship between the various embodiments and/or configurations discussed. Different embodiments may have different advantages, and no particular advantage is necessarily required of any embodiment.

A contemporary computing platform may include a complex and multi-faceted hardware platform provided by Intel®, another vendor, or combinations of different hardware from different vendors. For example, a large data center such as may be provided by a cloud service provider (CSP), a high-performance computing (HPC) cluster, or a hardware platform may include rack-mounted servers with compute resources such as processors, memory, storage pools, accelerators, and other similar resources. As used herein, "cloud computing" includes network-connected computing resources and technology that enables ubiquitous (often worldwide) access to data, resources, and/or technology. Cloud resources are generally characterized by flexibility to dynamically assign resources according to current workloads and needs. This can be accomplished, for example, by assigning a compute workload to a guest device, wherein resources such as hardware, storage, and networks are provided to a virtual machine, container, or disaggregated node by way of nonlimiting example.

In embodiments of the present disclosure, a processor includes any programmable logic device with an instruction set. Processors may be real or virtualized, local or remote, or in any other configuration. A processor may include, by way of nonlimiting example, an Intel® processor (e.g., Xeon®, Core™, Pentium®, Atom®, Celeron®, x86, or others). A processor may also include competing processors, such as AMD (e.g., Kx-series x86 workalikes, or Athlon, Opteron, or Epyc-series Xeon workalikes), ARM processors, or IBM PowerPC and Power ISA processors, to name just a few.

A modern data center or cloud computing center may rely on fiberoptic communication, particularly in spine networks where interconnect distances may be relatively large. These fiberoptic communications may be driven by systems-on-a-chip, or other integrated circuits that employ silicon photonics or other methods for generating a laser pulse on a silicon integrated circuit. Embodiments can include the use of semiconductor III-V silicon hybrid lasers. Electrical current for such lasers is injected via a current channel that is superimposed over an optical waveguide, which supports an optical mode, and is part of the laser cavity that provides optical gain. The current channel is defined through the entire length of the active optical waveguide. The optical mode may have a width of approximately 2 to 3 µm, and the current channel may need to be designed to match the width of the optical mode. However, a 2 to 3 µm current channel is quite narrow, and can result in a relatively high resistivity for the current channel. It is desirable to have a wider current channel with a lower resistivity, and therefore a higher conductivity, but the need to match the width of the optical mode means that it may not be possible to have an overall wider current channel.

However, embodiments of the present specification describe a current channel that is V-shaped, and therefore matches the optical mode at a lower end, while the V-shape provides an overall wider current channel with overall higher conductivity. This maximizes current injection efficiency in a III-V silicon hybrid laser, while minimizing series resistance.

Existing manufacturing methods may use a 7°-angled deep proton (H+) implant to define the current channel. Electrical current is injected and confined in the P-doped side of the laser. Matching the width of the current channel to the size of the optical mode to achieve high injection efficiency requires the use of narrow current channels that yield relatively high series resistance, generate self-heating, and increase power consumption.

Proton implantation is currently used to define the current channel, which feeds the active optical waveguide that provides optical gain and runs through the entire length of the active optical waveguide. The current channel is defined on the P-side of III-V silicon hybrid lasers. Generally, a straight or low angle of implant may be used, which results in relatively high series resistance when matching the width of the current channel to the size of the optical mode. To maximize efficiency, the optical mode is generally small, on the order of 3 μm or less in diameter. Embodiments of the present specification include the use of a higher angle of implantation (e.g., greater than 20°) for the protons to define a V-shaped implant current channel with relatively narrow width near the optical mode, but with relatively higher width at an end removed from the optical mode. This maximizes efficiency and provides a wider width at the P-contact level.

In one embodiment, the implantation is performed in two steps with the help of a negative resist that provides a V-shaped mask, with sidewalls matching the implant angle. The two-step implantation is performed at plus or minus the desired angle, which results in a symmetric V-shaped implant.

Advantageously, the V-shaped proton implant current channel results in good matching of the current channel near the optical mode, while avoiding the penalty of series resistance as the width of the current channel is kept wide at the contact level. High injection efficiency of the current in the optical mode can be achieved while avoiding the self-heating and extra power consumption realized in a straight implant method.

A system and method for providing a current channel for a silicon laser will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

FIG. 1 is a cutaway illustration of a cross-section of a V-shaped current channel. In this example, an angled photo-resist mask 124 is joined with a vacuum 130. Photo-resist mask 124 is substantially an inverted isosceles trapezoid with a re-entrant angle between about 20° and 30°.

As illustrated, the contact area between photo-resist mask 124 and vacuum 130 is 4.326 μm. Photo-resist mask 124 meets P-side cladding 104. Current flows from P-side cladding 104 to N-side cladding 108. An active layer 112 is defined below P-side cladding 104, and an optical mode 120 is shown at active layer 112. Together, N-side cladding 108, P-side cladding 104, and active layer 112 provide a laser diode junction, which provides laser pulses for fiberoptic communication. When P-side cladding 104 is bombarded with photons or with protons, photo-resist mask 124 ensures that protons are not embedded in non-implanted region 116. Non-implanted region 116 will form the current channel. As illustrated in this FIGURE, non-implanted region 116 is V-shaped, and is wider at the top than at the bottom. For example, optical mode 120 may be approximately 2 to 3 μm wide, and non-implanted region 116 may have a proximate surface to optical mode 120 that has a width approximately equal to the radius of optical mode 120. Thus, the proximate end of non-implanted region 116 may also be approximately 2 to 3 μm. In the particular example of FIG. 1, an embodiment is illustrated wherein the proximate end of non-implanted region 116 measures 2.738 μm. In this case, a removed end of non-implanted region 116 has a width of approximately 4.326 μm. This provides a current channel with a higher cross-sectional surface area, and thus higher conductivity and lower resistivity than would be realized if a straight-weld current channel were used.

Figure 2:
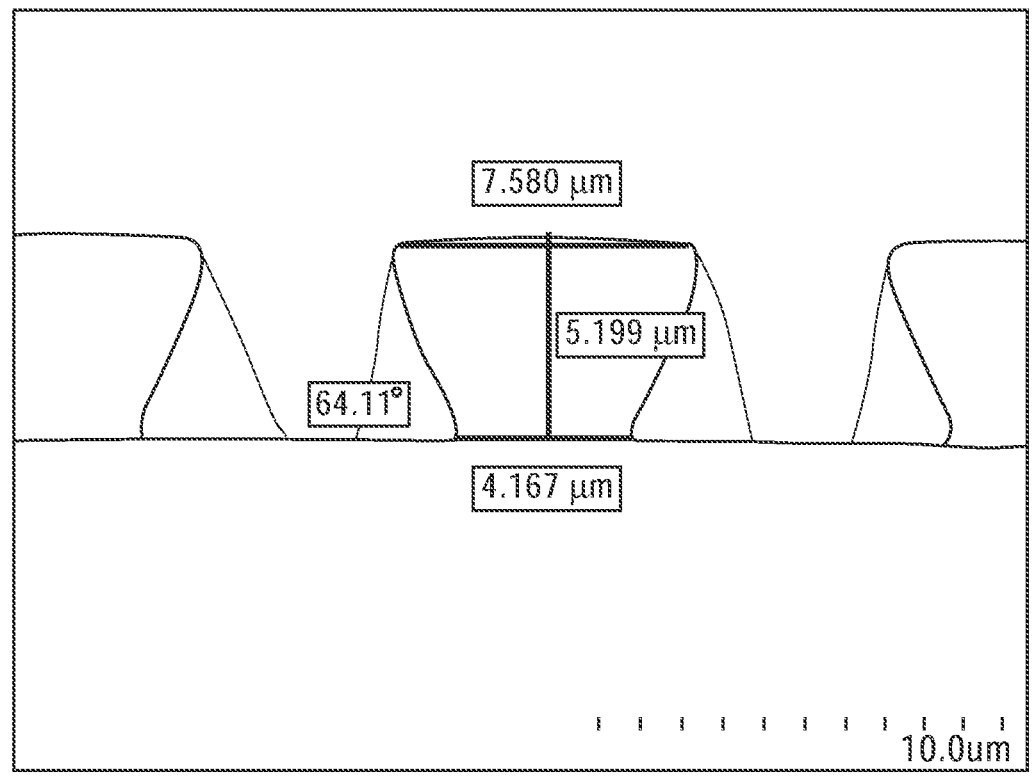
FIG. 2 illustrates a symmetric V-shaped implant profile realized through two-step proton implantation and a V-shaped mask.

Turning to FIG. 2, a symmetric V-shaped implant profile is realized through the combination of two-step proton implantation along with the use of a V-shaped mask with re-entrant sidewalls. The mask with re-entrant sidewalls is defined using negative photo-resist or reversible positive resist, some embodiments of which are known to yield re-entrant sidewalls when exposed with defocused conditions. FIG. 2 illustrates a photo-resist mask profile cross-section. Note that control of the V-shape and the angle of the re-entrant sidewalls depend on the condition of exposure, for example energy or defocusing. It may also depend on the nature of the surface, such as adhesion or reflectance. Appropriate conditions can yield a well-defined V-shaped with controlled re-entrant angle up to 30° counted from the vertical. The series resistance is lowered compared to a straight implant as the effective width of the channel, as well as the width at the top contact layer, is increased. FIG. 2 illustrates one example of a photo-resist mask for manufacturing a V-shaped current channel. In this case, a proximate end of the photo-resist mask has a width of approximately 4.167 μm, while a removed end has a width of 7.580 μm. The photo-resist mask has a height of 5.199 μm, with an angle between the proximate end and the removed end of approximately 64.11°.

Figure 3:
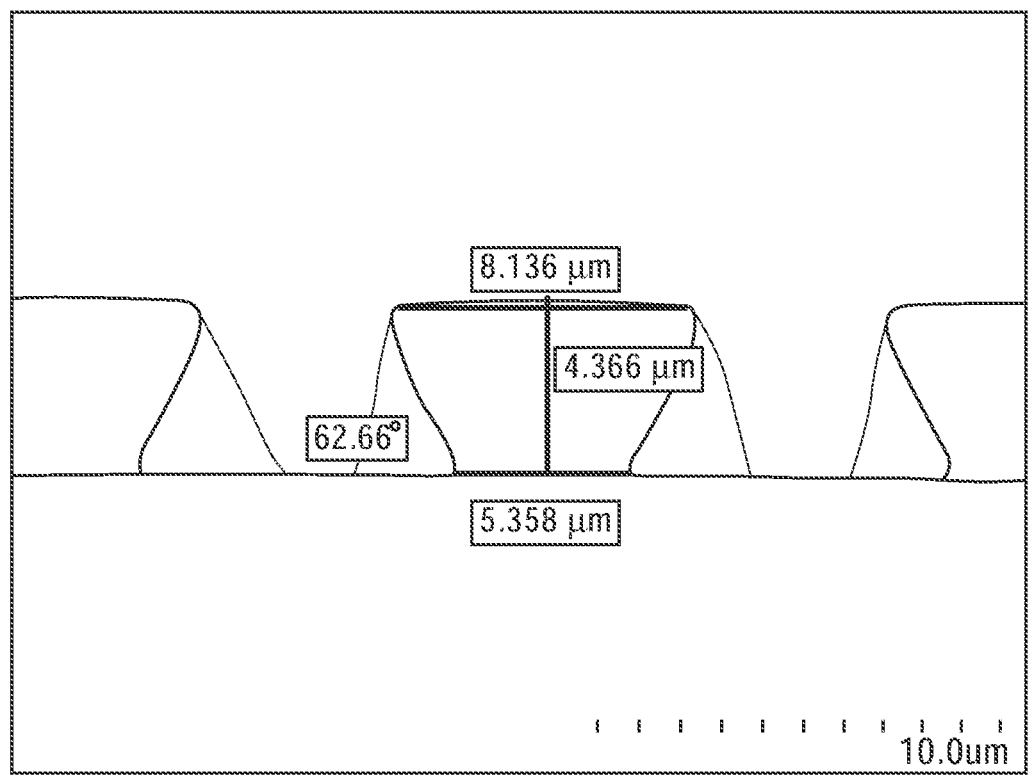
FIG. 3 illustrates a second embodiment of a photo-resist mask.

FIG. 3 illustrates a second embodiment of a photo-resist mask. In this case, a proximate end has a width of 5.358 μm, while the removed end has a width of 8.136 μm. The height of the photo-resist mask is 4.366 μm, with an angle between the proximate end and the removed end of approximately 62.66°. Note that the photo-resist mask of FIG. 2 will result in a contact area for the V-shaped current channel of approximately 4.167 μm, while FIG. 3 will result in an even larger contact area of approximately 5.358 μm.

Figure 4:
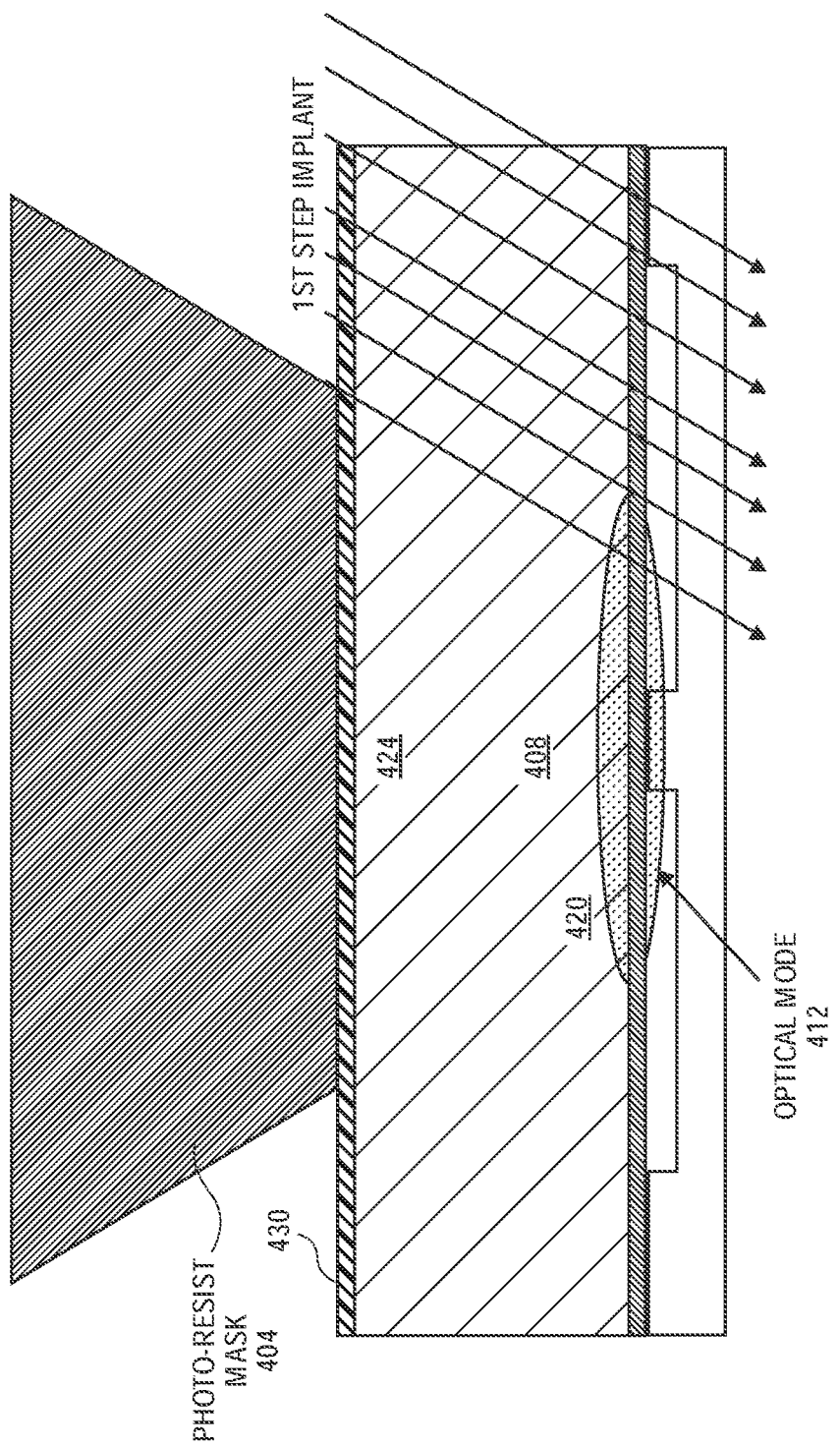
FIGS. 4 and 5 illustrate a two-step proton implant.
Figure 5:
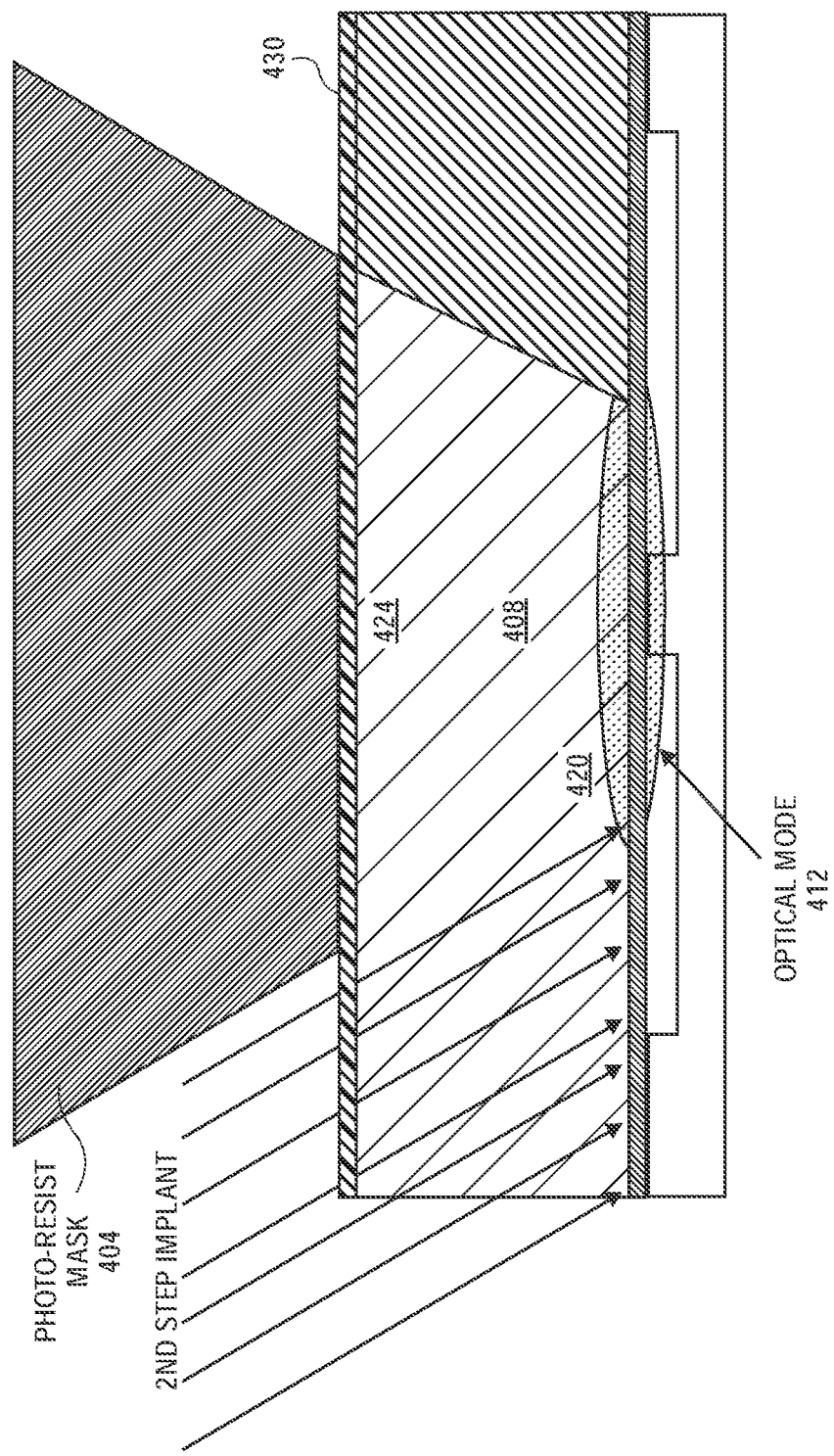

FIGS. 4 and 5 illustrate a two-step proton implantation process. In an embodiment, proton implantation is performed with an angle of implant matching the re-entrant angle of the photo-resist mask to yield a V-shaped implantation profile. To obtain a symmetric V-shaped implant current channel, the implantation is performed in two steps, with steps being performed at the positive and negative angle of the vertical, as illustrated in FIGS. 4 and 5.

Specifically, FIG. 4 illustrates step 1. Proton implantation occurs at a first angle on a first side of photo-resist mask 404. This provides a partially-formed current channel 408 that matches approximately to optical mode 412.

FIG. 5 illustrates step 2. At the second-step implantation, proton bombardment occurs at a second angle to define the other end of the partially-formed V-shaped current channel 408. This provides a proximate end 420 of current channel 408 that has a width approximately matching the circumference of optical mode 412. However, a removed end 424 of current channel 408 has a greater width, thus providing an overall larger current channel 408 with higher conductivity. Note that a conductive layer 430 may also be provided. Conductive layer 430 may be a highly-doped layer of, for example, indium gallium arsenide (InGaAs). Having a wider removed edge 424 also reduces the contact resistance between current channel 408 and conductive layer 430.

FIG. 6 illustrates the resultant V-shaped current channel 604. Again, V-shaped current channel 604 has a proximate end 620 to optical mode 612, and a removed end 624. Also shown is conductive layer 630.

FIG. 7 illustrates a straight current channel. Comparing FIG. 6 to FIG. 7, it can be seen that V-shaped current channel 604 of FIG. 6 realizes lower resistivity and higher conductivity than straight current channel 704. This is because V-shaped current channel 604 has a higher cross-sectional surface area than straight current channel 704 of FIG. 7. Furthermore, the contact resistance between V-shaped current channel 604 and conductive layer 630 is lower because of the higher contact area than would be realized by straight current channel 704 of FIG. 7.

Figure 8:
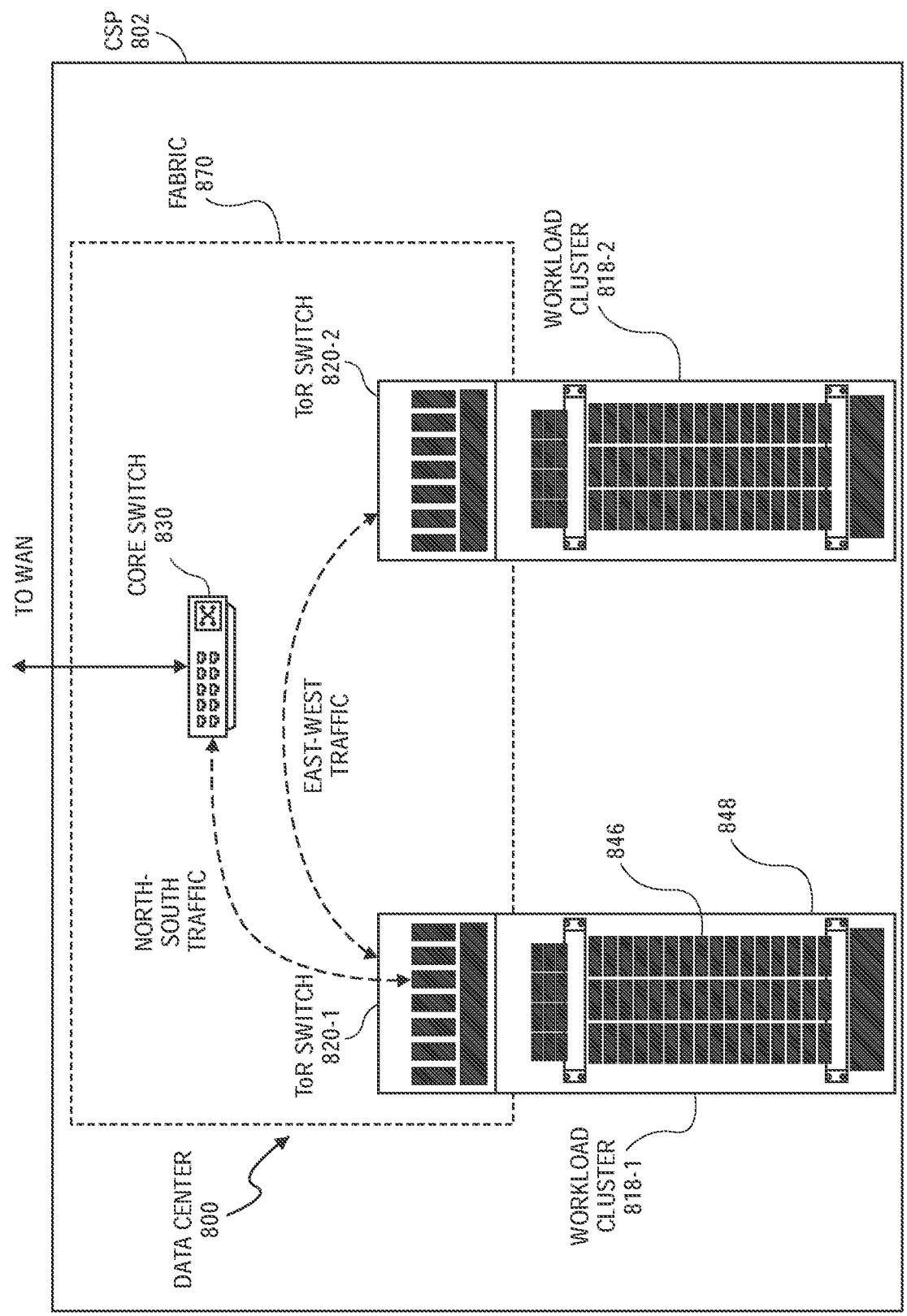
FIG. 8 is a block diagram of selected components of a data center with network connectivity.

FIG. 8 is a block diagram of selected components of a data center 800 with network connectivity. Embodiments of data center 800 disclosed herein may be adapted or configured to provide a current channel for a silicon laser, according to the teachings of the present specification. Data center 800 is disclosed in this illustration as a data center operated by a CSP 802, but this is an illustrative example only. The principles illustrated herein may also be applicable to an HPC cluster, a smaller "edge" data center, a microcloud, or other interconnected compute structure.

CSP 802 may be, by way of nonlimiting example, a traditional enterprise data center, an enterprise "private cloud," or a "public cloud," providing services such as infrastructure as a service (IaaS), platform as a service (PaaS), or software as a service (SaaS). In some cases, CSP 802 may provide, instead of or in addition to cloud services, HPC platforms or services. Indeed, while not expressly identical, HPC clusters ("supercomputers") may be structurally similar to cloud data centers, and unless expressly specified, the teachings of this specification may be applied to either. In general usage, the "cloud" is considered to be separate from an enterprise data center. Whereas an enterprise data center may be owned and operated on-site by an enterprise, a CSP provides third-party compute services to a plurality of "tenants." Each tenant may be a separate user or enterprise, and may have its own allocated resources, SLAs, and similar.

CSP 802 may provision some number of workload clusters 818, which may be clusters of individual servers, blade servers, rackmount servers, or any other suitable server topology. In this illustrative example, two workload clusters, 818-1 and 818-2 are shown, each providing rackmount servers 846 in a chassis 848.

In this illustration, workload clusters 818 are shown as modular workload clusters conforming to the rack unit ("U") standard, in which a standard rack, 19 inches wide, may accommodate up to 42 units (42 U), each 1.75 inches high and approximately 36 inches deep. In this case, compute resources such as processors, memory, storage, accelerators, and switches may fit into some multiple of rack units from 1 U to 42 U.

In the case of a traditional rack-based data center, each server 846 may host a standalone operating system and provide a server function, or servers may be virtualized, in which case they may be under the control of a virtual machine manager (VMM), hypervisor, and/or orchestrator. Each server may then host one or more virtual machines, virtual servers, or virtual appliances. These server racks may be collocated in a single data center, or may be located in different geographic data centers. Depending on contractual agreements, some servers 846 may be specifically dedicated to certain enterprise clients or tenants, while others may be shared.

The various devices in a data center may be connected to each other via a switching fabric 870, which may include one or more high speed routing and/or switching devices. Switching fabric 870 may provide both "north-south" traffic (e.g., traffic to and from the wide area network (WAN), such as the Internet), and "east-west" traffic (e.g., traffic across the data center). Historically, north-south traffic accounted for the bulk of network traffic, but as web services become more complex and distributed, the volume of east-west traffic has risen. In many data centers, east-west traffic now accounts for the majority of traffic.

Furthermore, as the capability of each server 846 increases, traffic volume may further increase. For example, each server 846 may provide multiple processor slots, with each slot accommodating a processor having four to eight cores, along with sufficient memory for the cores. Thus, each server may host a number of virtual machines (VMs), each generating its own traffic.

To accommodate the large volume of traffic in a data center, a highly capable switching fabric 870 may be provided. As used throughout this specification, a "fabric" should be broadly understood to include any combination of physical interconnects, protocols, media, and support resources that provide communication between one or more first discrete devices and one or more second discrete devices. Fabrics may be one-to-one, one-to-many, many-to-one, or many-to-many.

In some embodiments, fabric 870 may provide communication services on various "layers," as outlined in the Open Systems Interconnection (OSI) seven-layer network model. In contemporary practice, the OSI model is not followed strictly. In general terms, layers 1 and 2 are often called the "Ethernet" layer (though in some data centers or supercomputers, Ethernet may be supplanted or supplemented by newer technologies). Layers 3 and 4 are often referred to as the transmission control protocol/internet protocol (TCP/IP) layer (which may be further subdivided into TCP and IP layers). Layers 5-7 may be referred to as the "application layer." These layer definitions are disclosed as a useful framework, but are intended to be nonlimiting.

Switching fabric 870 is illustrated in this example as a "flat" network, wherein each server 846 may have a direct connection to a top-of-rack (ToR) switch 820 (e.g., a "star" configuration). Note that ToR is a common and historical name, and ToR switch 820 may, in fact, be located anywhere on the rack. Some data centers place ToR switch 820 in the middle of the rack to reduce the average overall cable length.

Each ToR switch 820 may couple to a core switch 830. This two-tier flat network architecture is shown only as an illustrative example. In other examples, other architectures may be used, such as three-tier star or leaf-spine (also called "fat tree" topologies) based on the "Clos" architecture, hub-and-spoke topologies, mesh topologies, ring topologies, or 3-D mesh topologies, by way of nonlimiting example.

The fabric itself may be provided by any suitable interconnect. For example, each server 846 may include an Intel® Host Fabric Interface (HFI), a network interface card (NIC), intelligent NIC (iNIC), smart NIC, a host channel adapter (HCA), or other host interface. For simplicity and unity, these may be referred to throughout this specification as a "fabric adapter" (FA), which should be broadly construed as an interface to communicatively couple the host to the data center fabric. The FA may couple to one or more host processors via an interconnect or bus, such as PCI, PCIe, or similar, referred to herein as a "local fabric." Multiple processor may communicate with one another via a special interconnects such as a core-to-core Ultra Path Interconnect (UPI), Infinity Fabric, etc. Generically, these interconnects may be referred to as an "inter-processor fabric." The treatment of these various fabrics may vary from vendor to vendor and from architecture to architecture. In some cases, one or both of the local fabric and the inter-processor fabric may be treated as part of the larger data center fabric 872. Some FAs have the capability to dynamically handle a physical connection with a plurality of protocols (e.g., either Ethernet or PCIe, depending on the context), in which case PCIe connections to other parts of a rack may usefully be treated as part of fabric 872. In other embodiments, PCIe is used exclusively within a local node, sled, or sled chassis, in which case it may not be logical to treat the local fabric as part of data center fabric 872. In yet other embodiments, it is more logically to treat the inter-processor fabric as part of the secure domain of the processor complex, and thus treat it separately from the local fabric and/or data center fabric 872. In particular, the inter-processor fabric may be cache and/or memory-coherent, meaning that coherent devices can map to the same memory address space, with each treating that address space as its own local address space. Many data center fabrics and local fabrics lack coherency, and so it may be beneficial to treat inter-processor fabric, the local fabric, and the data center fabric as one cohesive fabric, or two or three separate fabrics. Furthermore, the illustration of three levels of fabric in this example should not be construed to exclude more or fewer levels of fabrics, or the mixture of other kinds of fabrics. For example, many data centers use copper interconnects for short communication distances, and fiberoptic interconnects for longer distances.

Thus, fabric 870 may be provided by a single interconnect or a hybrid interconnect, such as where PCIe provides on-chip (for a system-on-a-chip) or on-board communication, 1 Gb or 10 Gb copper Ethernet provides relatively short connections to a ToR switch 820, and optical cabling provides relatively longer connections to core switch 830. Interconnect technologies that may be found in the data center include, by way of nonlimiting example, Intel® silicon photonics, an Intel® HFI, a NIC, intelligent NIC (iNIC), smart NIC, an HCA or other host interface, PCI, PCIe, a core-to-core UPI (formerly called QPI or KTI), Infinity Fabric, Intel® Omni-Path™ Architecture (OPA), TrueScale™, FibreChannel, Ethernet, FibreChannel over Ethernet (FCoE), InfiniBand, a legacy interconnect such as a local area network (LAN), a token ring network, a synchronous optical network (SONET), an asynchronous transfer mode (ATM) network, a wireless network such as Wi-Fi or Bluetooth, a "plain old telephone system" (POTS) interconnect or similar, a multi-drop bus, a mesh interconnect, a point-to-point interconnect, a serial interconnect, a parallel bus, a coherent (e.g., cache coherent) bus, a layered protocol architecture, a differential bus, or a Gunning transceiver logic (GTL) bus, to name just a few. The fabric may be cache- and memory-coherent, cache and memory non-coherent, or a hybrid of coherent and non-coherent interconnects. Some interconnects are more popular for certain purposes or functions than others, and selecting an appropriate fabric for the instant application is an exercise of ordinary skill. For example, OPA and Infiniband are commonly used in HPC applications, while Ethernet and Fibre-Channel are more popular in cloud data centers. But these examples are expressly nonlimiting, and as data centers evolve fabric technologies similarly evolve.

Note that while high-end fabrics such as OPA are provided herein by way of illustration, more generally, fabric 870 may be any suitable interconnect or bus for the particular application. This could, in some cases, include legacy interconnects like LANs, token ring networks, synchronous optical networks (SONET), ATM networks, wireless networks such as Wi-Fi and Bluetooth, POTS interconnects, or similar. It is also expressly anticipated that in the future, new network technologies may arise to supplement or replace some of those listed here, and any such future network topologies and technologies can be or form a part of fabric 870.

Figure 9:
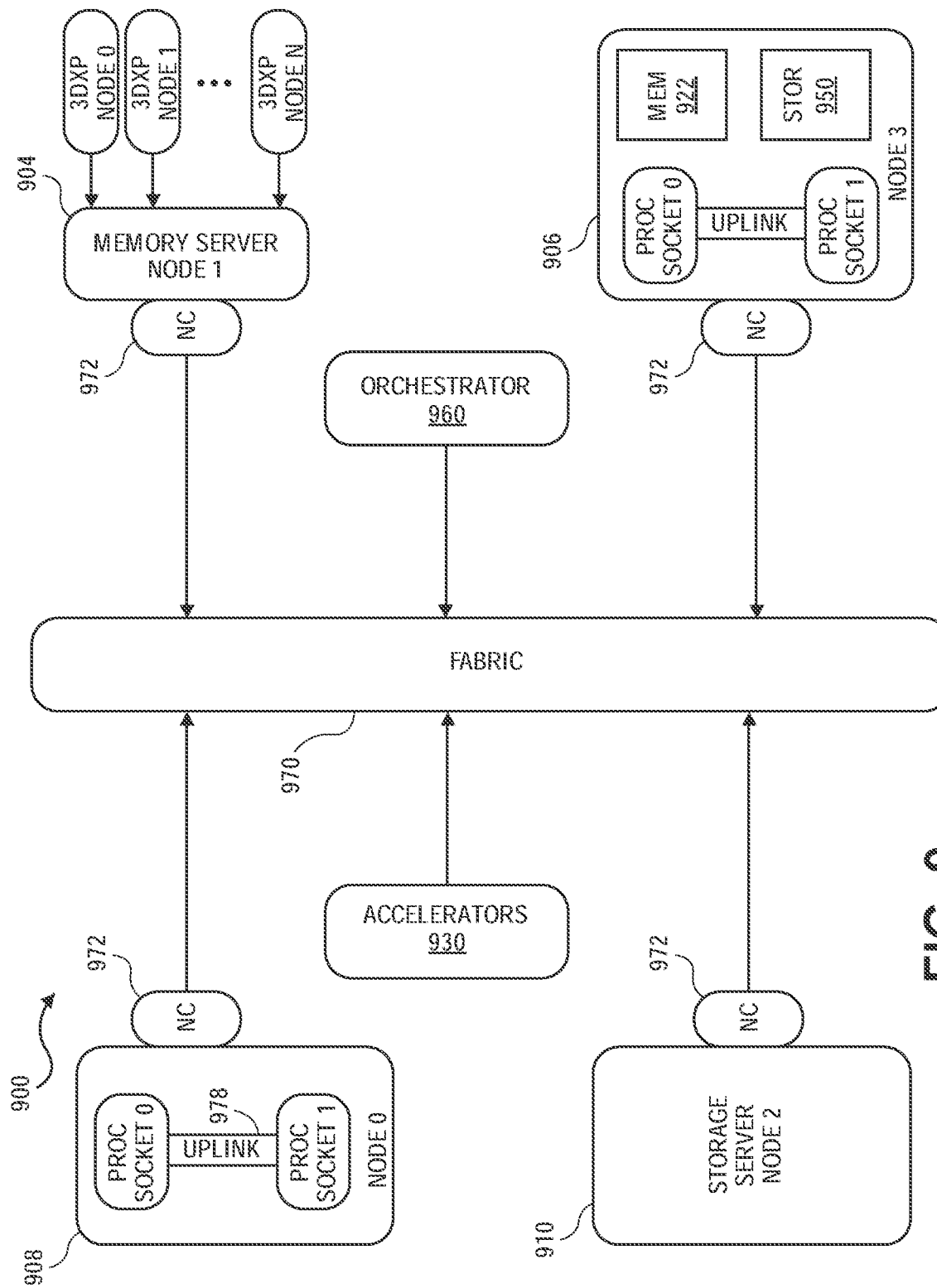
FIG. 9 is a block diagram of selected components of an end-user computing device.

FIG. 9 is a block diagram of an end-user computing device 900. Embodiments of computing device 900 disclosed herein may be adapted or configured to provide a current channel for a silicon laser, according to the teachings of the present specification. As above, computing device 900 may provide, as appropriate, cloud service, HPC, telecommunication services, enterprise data center services, or any other compute services that benefit from a computing device 900.

In this example, a fabric 970 is provided to interconnect various aspects of computing device 900. Fabric 970 may be the same as fabric 870 of FIG. 8, or may be a different fabric. As above, fabric 970 may be provided by any suitable interconnect technology. In this example, Intel® Omni-Path™ is used as an illustrative and nonlimiting example.

As illustrated, computing device 900 includes a number of logic elements forming a plurality of nodes. It should be understood that each node may be provided by a physical server, a group of servers, or other hardware. Each server may be running one or more virtual machines as appropriate to its application.

Node 0 908 is a processing node including a processor socket 0 and processor socket 1. The processors may be, for example, Intel® Xeon™ processors with a plurality of cores, such as 4 or 8 cores. Node 0 908 may be configured to provide network or workload functions, such as by hosting a plurality of virtual machines or virtual appliances.

On-board communication between processor socket 0 and processor socket 1 may be provided by an on-board uplink 978. This may provide a very high speed, short-length interconnect between the two processor sockets, so that virtual machines running on node 0 908 can communicate with one another at very high speeds. To facilitate this communication, a virtual switch (vSwitch) may be provisioned on node 0 908, which may be considered to be part of fabric 970.

Node 0 908 connects to fabric 970 via a network controller (NC) 972. NC 972 provides physical interface (a PHY level) and logic to communicatively couple a device to a fabric. For example, NC 972 may be a NIC to communicatively couple to an Ethernet fabric or an HFI to communicatively couple to a clustering fabric such as an Intel® Omni-Path™, by way of illustrative and nonlimiting example. In some examples, communication with fabric 970 may be tunneled, such as by providing UPI tunneling over Omni-Path™.

Because computing device 900 may provide many functions in a distributed fashion that in previous generations were provided on-board, a highly capable NC 972 may be provided. NC 972 may operate at speeds of multiple gigabits per second, and in some cases may be tightly coupled with node 0 908. For example, in some embodiments, the logic for NC 972 is integrated directly with the processors on a system-on-a-chip (SoC). This provides very high speed communication between NC 972 and the processor sockets, without the need for intermediary bus devices, which may introduce additional latency into the fabric. However, this is not to imply that embodiments where NC 972 is provided over a traditional bus are to be excluded. Rather, it is expressly anticipated that in some examples, NC 972 may be provided on a bus, such as a PCIe bus, which is a serialized version of PCI that provides higher speeds than traditional PCI. Throughout computing device 900, various nodes may provide different types of NCs 972, such as on-board NCs and plug-in NCs. It should also be noted that certain blocks in an SoC may be provided as IP blocks that can be "dropped" into an integrated circuit as a modular unit. Thus, NC 972 may in some cases be derived from such an IP block.

Note that in "the network is the device" fashion, node 0 908 may provide limited or no on-board memory or storage. Rather, node 0 908 may rely primarily on distributed services, such as a memory server and a networked storage server. On-board, node 0 908 may provide only sufficient memory and storage to bootstrap the device and get it communicating with fabric 970. This kind of distributed architecture is possible because of the very high speeds of contemporary data centers, and may be advantageous because there is no need to over-provision resources for each node. Rather, a large pool of high speed or specialized memory may be dynamically provisioned between a number of nodes, so that each node has access to a large pool of resources, but those resources do not sit idle when that particular node does not need them.

In this example, a node 1 memory server 904 and a node 2 storage server 910 provide the operational memory and storage capabilities of node 0 908. For example, memory server node 1 904 may provide remote direct memory access (RDMA), whereby node 0 908 may access memory resources on node 1 904 via fabric 970 in a direct memory access fashion, similar to how it would access its own on-board memory. The memory provided by memory server 904 may be traditional memory, such as double data rate type 3 (DDR3) dynamic random access memory (DRAM), which is volatile, or may be a more exotic type of memory, such as a persistent fast memory (PFM) like Intel® 3D Crosspoint™ (3DXP), which operates at DRAM-like speeds, but is non-volatile.

Similarly, rather than providing an on-board hard disk for node 0 908, a storage server node 2 910 may be provided. Storage server 910 may provide a networked bunch of disks (NBOD), PFM, redundant array of independent disks (RAID), redundant array of independent nodes (RAIN), network-attached storage (NAS), optical storage, tape drives, or other non-volatile memory solutions.

Thus, in performing its designated function, node 0 908 may access memory from memory server 904 and store results on storage provided by storage server 910. Each of these devices couples to fabric 970 via an NC 972, which provides fast communication that makes these technologies possible.

By way of further illustration, node 3 906 is also depicted. Node 3 906 also includes an NC 972, along with two processor sockets internally connected by an uplink. However, unlike node 0 908, node 3 906 includes its own on-board memory 922 and storage 950. Thus, node 3 906 may be configured to perform its functions primarily on-board, and may not be required to rely upon memory server 904 and storage server 910. However, in appropriate circumstances, node 3 906 may supplement its own on-board memory 922 and storage 950 with distributed resources similar to node 0 908.

Computing device 900 may also include accelerators 930. These may provide various accelerated functions, including hardware or co-processor acceleration for functions such as packet processing, encryption, decryption, compression, decompression, network security, or other accelerated functions in the data center. In some examples, accelerators 930 may include deep learning accelerators that may be directly attached to one or more cores in nodes such as node 0 908 or node 3 906. Examples of such accelerators can include, by way of nonlimiting example, Intel® QuickData Technology (QDT), Intel® QuickAssist Technology (QAT), Intel® Direct Cache Access (DCA), Intel® Extended Message Signaled Interrupt (MSI-X), Intel® Receive Side Coalescing (RSC), and other acceleration technologies.

In other embodiments, an accelerator could also be provided as an application-specific integrated circuit (ASIC), field-programmable gate array (FPGA), co-processor, graphics processing unit (GPU), digital signal processor (DSP), or other processing entity, which may optionally be tuned or configured to provide the accelerator function.

The basic building block of the various components disclosed herein may be referred to as "logic elements." Logic elements may include hardware (including, for example, a software-programmable processor, an ASIC, or an FPGA), external hardware (digital, analog, or mixed-signal), software, reciprocating software, services, drivers, interfaces, components, modules, algorithms, sensors, components, firmware, microcode, programmable logic, or objects that can coordinate to achieve a logical operation. Furthermore, some logic elements are provided by a tangible, non-transitory computer-readable medium having stored thereon executable instructions for instructing a processor to perform a certain task. Such a non-transitory medium could include, for example, a hard disk, solid state memory or disk, read-only memory (ROM), PFM (e.g., Intel® 3D Crosspoint™), external storage, RAID, RAIN, NAS, optical storage, tape drive, backup system, cloud storage, or any combination of the foregoing by way of nonlimiting example. Such a medium could also include instructions programmed into an FPGA, or encoded in hardware on an ASIC or processor.

Figure 10:
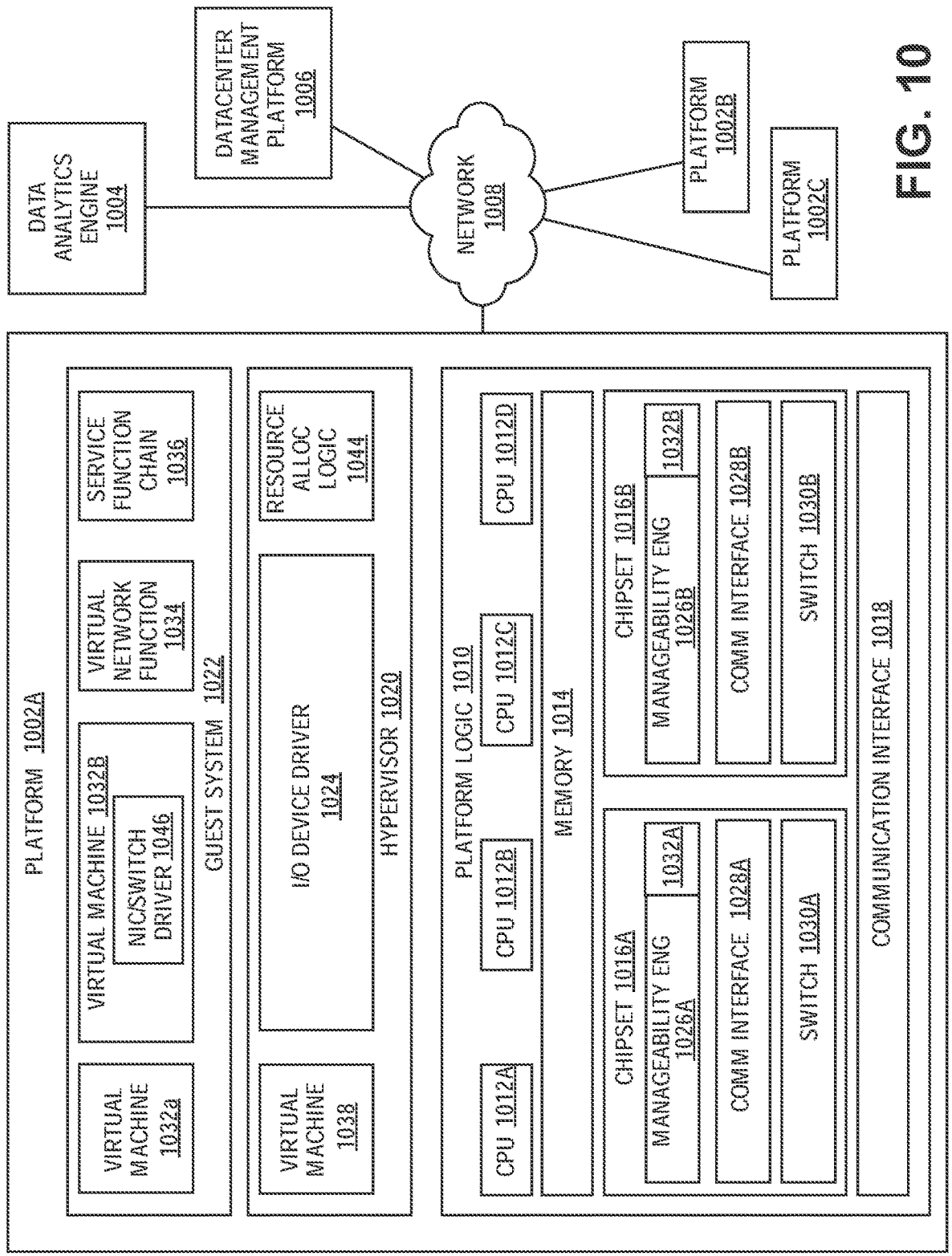
FIG. 10 is a block diagram of components of a computing platform.

FIG. 10 is a block diagram of components of a computing platform 1002A. Embodiments of computing platform 1002A disclosed herein may be adapted or configured to provide a current channel for a silicon laser, according to the teachings of the present specification.

In the embodiment depicted, hardware platforms 1002A, 1002B, and 1002C, along with a data center management platform 1006 and data analytics engine 1004 are interconnected via network 1008. In other embodiments, a computer system may include any suitable number of (i.e., one or more) platforms, including hardware, software, firmware, and other components. In some embodiments (e.g., when a computer system only includes a single platform), all or a portion of the system management platform 1006 may be included on a platform 1002. A platform 1002 may include platform logic 1010 with one or more central processing units (CPUs) 1012, memories 1014 (which may include any number of different modules), chipsets 1016, communication interfaces 1018, and any other suitable hardware and/or software to execute a hypervisor 1020 or other operating system capable of executing workloads associated with applications running on platform 1002. In some embodiments, a platform 1002 may function as a host platform for one or more guest systems 1022 that invoke these applications. Platform 1002A may represent any suitable computing environment, such as a high-performance computing environment, a data center, a communications service provider infrastructure (e.g., one or more portions of an Evolved Packet Core), an in-memory computing environment, a computing system of a vehicle (e.g., an automobile or airplane), an Internet of Things environment, an industrial control system, other computing environment, or combination thereof.

In various embodiments of the present disclosure, accumulated stress and/or rates of stress accumulated of a plurality of hardware resources (e.g., cores and uncores) are monitored and entities (e.g., system management platform 1006, hypervisor 1020, or other operating system) of computer platform 1002A may assign hardware resources of platform logic 1010 to perform workloads in accordance with the stress information. In some embodiments, self-diagnostic capabilities may be combined with the stress monitoring to more accurately determine the health of the hardware resources. Each platform 1002 may include platform logic 1010. Platform logic 1010 comprises, among other logic enabling the functionality of platform 1002, one or more CPUs 1012, memory 1014, one or more chipsets 1016, and communication interfaces 1028. Although three platforms are illustrated, computer platform 1002A may be interconnected with any suitable number of platforms. In various embodiments, a platform 1002 may reside on a circuit board that is installed in a chassis, rack, or other suitable structure that comprises multiple platforms coupled together through network 1008 (which may comprise, e.g., a rack or backplane switch).

CPUs 1012 may each comprise any suitable number of processor cores and supporting logic (e.g., uncores). The cores may be coupled to each other, to memory 1014, to at least one chipset 1016, and/or to a communication interface 1018, through one or more controllers residing on CPU 1012 and/or chipset 1016. In particular embodiments, a CPU 1012 is embodied within a socket that is permanently or removably coupled to platform 1002A. Although four CPUs are shown, a platform 1002 may include any suitable number of CPUs.

Memory 1014 may comprise any form of volatile or non-volatile memory including, without limitation, magnetic media (e.g., one or more tape drives), optical media, random access memory (RAM), ROM, flash memory, removable media, or any other suitable local or remote memory component or components. Memory 1014 may be used for short, medium, and/or long-term storage by platform 1002A. Memory 1014 may store any suitable data or information utilized by platform logic 1010, including software embedded in a computer-readable medium, and/or encoded logic incorporated in hardware or otherwise stored (e.g., firmware). Memory 1014 may store data that is used by cores of CPUs 1012. In some embodiments, memory 1014 may also comprise storage for instructions that may be executed by the cores of CPUs 1012 or other processing elements (e.g., logic resident on chipsets 1016) to provide functionality associated with the manageability engine 1026 or other components of platform logic 1010. A platform 1002 may also include one or more chipsets 1016 comprising any suitable logic to support the operation of the CPUs 1012. In various embodiments, chipset 1016 may reside on the same die or package as a CPU 1012 or on one or more different dies or packages. Each chipset may support any suitable number of CPUs 1012. A chipset 1016 may also include one or more controllers to couple other components of platform logic 1010 (e.g., communication interface 1018 or memory 1014) to one or more CPUs. In the embodiment depicted, each chipset 1016 also includes a manageability engine 1026. Manageability engine 1026 may include any suitable logic to support the operation of chipset 1016. In a particular embodiment, a manageability engine 1026 (which may also be referred to as an innovation engine) is capable of collecting real-time telemetry data from the chipset 1016, the CPU(s) 1012 and/or memory 1014 managed by the chipset 1016, other components of platform logic 1010, and/or various connections between components of platform logic 1010. In various embodiments, the telemetry data collected includes the stress information described herein.

In various embodiments, a manageability engine 1026 operates as an out-of-band asynchronous compute agent which is capable of interfacing with the various elements of platform logic 1010 to collect telemetry data with no or minimal disruption to running processes on CPUs 1012. For example, manageability engine 1026 may comprise a dedicated processing element (e.g., a processor, controller, or other logic) on chipset 1016, which provides the functionality of manageability engine 1026 (e.g., by executing software instructions), thus conserving processing cycles of CPUs 1012 for operations associated with the workloads performed by the platform logic 1010. Moreover the dedicated logic for the manageability engine 1026 may operate asynchronously with respect to the CPUs 1012 and may gather at least some of the telemetry data without increasing the load on the CPUs.

A manageability engine 1026 may process telemetry data it collects (specific examples of the processing of stress information are provided herein). In various embodiments, manageability engine 1026 reports the data it collects and/or the results of its processing to other elements in the computer system, such as one or more hypervisors 1020 or other operating systems and/or system management software (which may run on any suitable logic such as system management platform 1006). In particular embodiments, a critical event such as a core that has accumulated an excessive amount of stress may be reported prior to the normal interval for reporting telemetry data (e.g., a notification may be sent immediately upon detection).

Additionally, manageability engine 1026 may include programmable code configurable to set which CPU(s) 1012 a particular chipset 1016 manages and/or which telemetry data may be collected.

Chipsets 1016 also each include a communication interface 1028. Communication interface 1028 may be used for the communication of signaling and/or data between chipset 1016 and one or more I/O devices, one or more networks 1008, and/or one or more devices coupled to network 1008 (e.g., system management platform 1006). For example, communication interface 1028 may be used to send and receive network traffic such as data packets. In a particular embodiment, a communication interface 1028 comprises one or more physical network interface controllers (NICs), also known as network interface cards or network adapters. A NIC may include electronic circuitry to communicate using any suitable physical layer and data link layer standard such as Ethernet (e.g., as defined by a IEEE 802.3 standard), Fibre Channel, InfiniBand, Wi-Fi, or other suitable standard. A NIC may include one or more physical ports that may couple to a cable (e.g., an Ethernet cable). A NIC may enable communication between any suitable element of chipset 1016 (e.g., manageability engine 1026 or switch 1030) and another device coupled to network 1008. In various embodiments a NIC may be integrated with the chipset (i.e., may be on the same integrated circuit or circuit board as the rest of the chipset logic) or may be on a different integrated circuit or circuit board that is electromechanically coupled to the chipset.

In particular embodiments, communication interfaces 1028 may allow communication of data (e.g., between the manageability engine 1026 and the data center management platform 1006) associated with management and monitoring functions performed by manageability engine 1026. In various embodiments, manageability engine 1026 may utilize elements (e.g., one or more NICs) of communication interfaces 1028 to report the telemetry data (e.g., to system management platform 1006) in order to reserve usage of NICs of communication interface 1018 for operations associated with workloads performed by platform logic 1010.

Switches 1030 may couple to various ports (e.g., provided by NICs) of communication interface 1028 and may switch data between these ports and various components of chipset 1016 (e.g., one or more Peripheral Component Interconnect Express (PCIe) lanes coupled to CPUs 1012). Switches 1030 may be a physical or virtual (i.e., software) switch.

Platform logic 1010 may include an additional communication interface 1018. Similar to communication interfaces 1028, communication interfaces 1018 may be used for the communication of signaling and/or data between platform logic 1010 and one or more networks 1008 and one or more devices coupled to the network 1008. For example, communication interface 1018 may be used to send and receive network traffic such as data packets. In a particular embodiment, communication interfaces 1018 comprise one or more physical NICs. These NICs may enable communication between any suitable element of platform logic 1010 (e.g., CPUs 1012 or memory 1014) and another device coupled to network 1008 (e.g., elements of other platforms or remote computing devices coupled to network 1008 through one or more networks).

Platform logic 1010 may receive and perform any suitable types of workloads. A workload may include any request to utilize one or more resources of platform logic 1010, such as one or more cores or associated logic. For example, a workload may comprise a request to instantiate a software component, such as an I/O device driver 1024 or guest system 1022; a request to process a network packet received from a virtual machine 1032 or device external to platform 1002A (such as a network node coupled to network 1008); a request to execute a process or thread associated with a guest system 1022, an application running on platform 1002A, a hypervisor 1020 or other operating system running on platform 1002A; or other suitable processing request.

A virtual machine 1032 may emulate a computer system with its own dedicated hardware. A virtual machine 1032 may run a guest operating system on top of the hypervisor 1020. The components of platform logic 1010 (e.g., CPUs 1012, memory 1014, chipset 1016, and communication interface 1018) may be virtualized such that it appears to the guest operating system that the virtual machine 1032 has its own dedicated components.

A virtual machine 1032 may include a virtualized NIC (vNIC), which is used by the virtual machine as its network interface. A vNIC may be assigned a media access control (MAC) address or other identifier, thus allowing multiple virtual machines 1032 to be individually addressable in a network.

VNF 1034 may comprise a software implementation of a functional building block with defined interfaces and behavior that can be deployed in a virtualized infrastructure. In particular embodiments, a VNF 1034 may include one or more virtual machines 1032 that collectively provide specific functionalities (e.g., WAN optimization, virtual private network (VPN) termination, firewall operations, load balancing operations, security functions, etcetera). A VNF 1034 running on platform logic 1010 may provide the same functionality as traditional network components implemented through dedicated hardware. For example, a VNF 1034 may include components to perform any suitable NFV workloads, such as virtualized evolved packet core (vEPC) components, mobility management entities, 3rd Generation Partnership Project (3GPP) control and data plane components, etc.

SFC 1036 is a group of VNFs 1034 organized as a chain to perform a series of operations, such as network packet processing operations. Service function chaining may provide the ability to define an ordered list of network services (e.g. firewalls, load balancers) that are stitched together in the network to create a service chain.

A hypervisor 1020 (also known as a virtual machine monitor) may comprise logic to create and run guest systems 1022. The hypervisor 1020 may present guest operating systems run by virtual machines with a virtual operating platform (i.e., it appears to the virtual machines that they are running on separate physical nodes when they are actually consolidated onto a single hardware platform) and manage the execution of the guest operating systems by platform logic 1010. Services of hypervisor 1020 may be provided by virtualizing in software or through hardware assisted resources that require minimal software intervention, or both. Multiple instances of a variety of guest operating systems may be managed by the hypervisor 1020. Each platform 1002 may have a separate instantiation of a hypervisor 1020.

Hypervisor 1020 may be a native or bare metal hypervisor that runs directly on platform logic 1010 to control the platform logic and manage the guest operating systems. Alternatively, hypervisor 1020 may be a hosted hypervisor that runs on a host operating system and abstracts the guest operating systems from the host operating system. Hypervisor 1020 may include a virtual switch 1038 that may provide virtual switching and/or routing functions to virtual machines of guest systems 1022. The virtual switch 1038 may comprise a logical switching fabric that couples the vNICs of the virtual machines 1032 to each other, thus creating a virtual network through which virtual machines may communicate with each other.

Virtual switch 1038 may comprise a software element that is executed using components of platform logic 1010. In various embodiments, hypervisor 1020 may be in communication with any suitable entity (e.g., a SDN controller) which may cause hypervisor 1020 to reconfigure the parameters of virtual switch 1038 in response to changing conditions in platform 1002 (e.g., the addition or deletion of virtual machines 1032 or identification of optimizations that may be made to enhance performance of the platform).

Hypervisor 1020 may also include resource allocation logic 1044, which may include logic for determining allocation of platform resources based on the telemetry data (which may include stress information). Resource allocation logic 1044 may also include logic for communicating with various components of platform logic 1010 entities of platform 1002A to implement such optimization, such as components of platform logic 1010.

Any suitable logic may make one or more of these optimization decisions. For example, system management platform 1006; resource allocation logic 1044 of hypervisor 1020 or other operating system; or other logic of computer platform 1002A may be capable of making such decisions.

In various embodiments, the system management platform 1006 may receive telemetry data from and manage workload placement across multiple platforms 1002. The system management platform 1006 may communicate with hypervisors 1020 (e.g., in an out-of-band manner) or other operating systems of the various platforms 1002 to implement workload placements directed by the system management platform.

The elements of platform logic 1010 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, or a GTL bus.

Elements of the computer platform 1002A may be coupled together in any suitable manner such as through one or more networks 1008. A network 1008 may be any suitable network or combination of one or more networks operating using one or more suitable networking protocols. A network may represent a series of nodes, points, and interconnected communication paths for receiving and transmitting packets of information that propagate through a communication system. For example, a network may include one or more firewalls, routers, switches, security appliances, antivirus servers, or other useful network devices.

Figure 11:
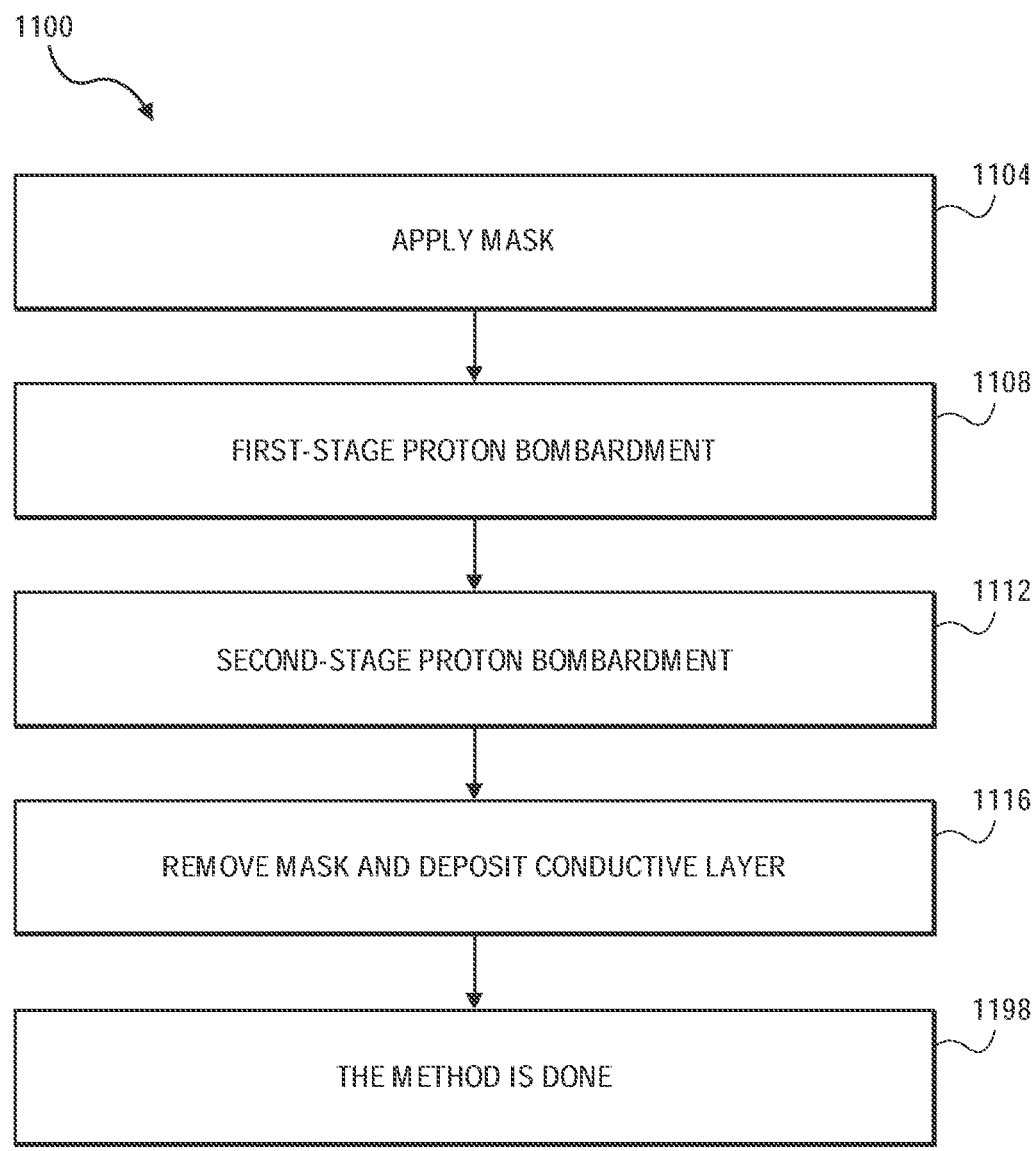
FIG. 11 is a flowchart of a method of etching a V-shaped current channel.

FIG. 11 is a flowchart of a method 1100 of etching a V-shaped current channel. Starting in block 1104, the photo-resist mask is applied to the substrate. As illustrated herein, the photo-resist mask may itself have substantially a V-shape, as illustrated for example in FIGS. 2 and 3.

In block 1108, first-stage proton bombardment occurs. As illustrated in FIG. 4, first-stage proton bombardment is a first implantation step, that bombards at a first angle to provide a first side of the V-shaped current channel.

At block 1112, second-stage proton bombardment occurs. As illustrated in FIG. 5, this is a second implantation step, wherein protons are bombarded at a second angle to provide the second side of the V-shaped current channel.

In block 1116, the photo-resist mask is removed, and the conductive layer is deposited and doped appropriately.

In block 1198, the method is done.

Figure 12:
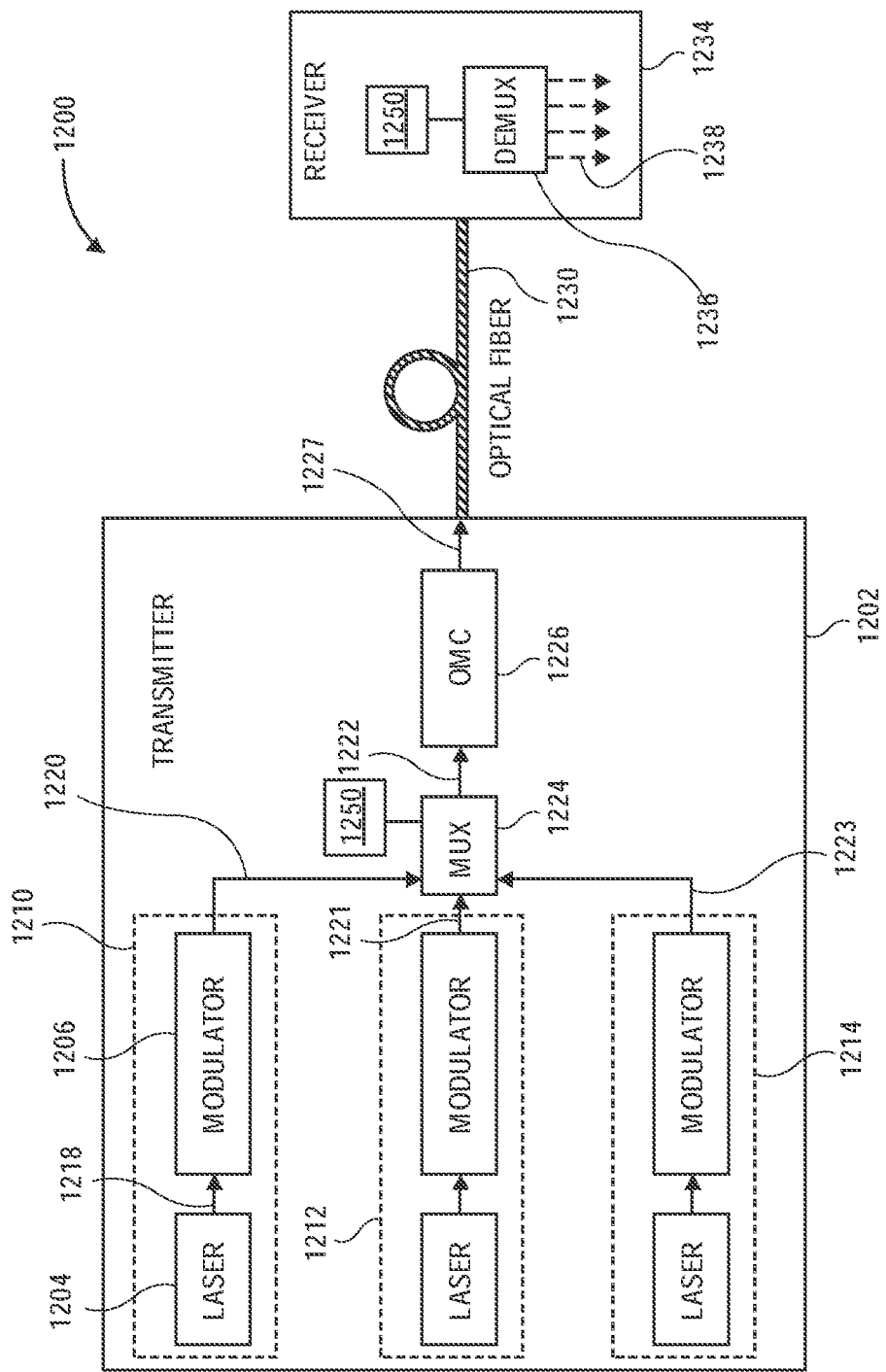
FIG. 12 is a block diagram of an optoelectronic system that may include a multiplexer and/or demultiplexer manufactured with a rib-channel converter of the present specification.

FIG. 12 is a block diagram of an optoelectronic system 1200 that may include a multiplexer and/or demultiplexer manufactured with a rib-channel converter of the present specification. The optoelectronic system 1200 may be used to transmit an optical signal modulated with a data signal via an optical fiber, for example, between racks in a data center, or long distance, between data storage facilities, data centers, and the like.

The optoelectronic system 1200 may include an optical device such as transmitter 1202 (e.g., a photonic chip). The transmitter 1202 may include one or more light sources (e.g., laser devices) 1204 to provide a light signal 1218 (e.g., constant light intensity signal) to a respective modulator 1206 to modulate input light according to a data signal to be transmitted. Each combination of a light source 1204 and corresponding modulator 1206 may comprise a communication channel 1210, 1212, or 1214. Although three communication channels are shown, fewer or multiple more communication channels may be used in a transmitter such as 1202 to provide, for example, a desired data transmission rate. The modulator 1206 may output a modulated optical signal 1220 to a multiplexer 1224 having a mirror 1250 with echelle grating providing a substantially total internal reflection of light as described herein. Similarly, communication channels 1212 and 1214 may output modulated signals 1221 and 1223 to the multiplexer 1224. Signals 1220, 1221, and 1223 multiplexed from communication channels 1210, 1212, and 1214 may be input as a combined signal 1222 to an optical mode converter (e.g., a coupler) 1226.

The optical mode converter 1226 may provide the interface from multiplexer 1224 with mirror 1250 on the photonic chip to an optical communication channel (e.g., optical fiber cable) 1230 and is configured to transfer the combined optical signal 1227 to the optical communication channel 1230, to be received by a receiver 1234. In embodiments, the receiver 1234 may include a demultiplexer 1236 having a mirror 1250 with echelle grating providing a substantially total internal reflection of light as described herein. The demultiplexer 1236 may be configured to demultiplex signal 1227 into multiple signals 1238, according to techniques described herein.

Figure 13:
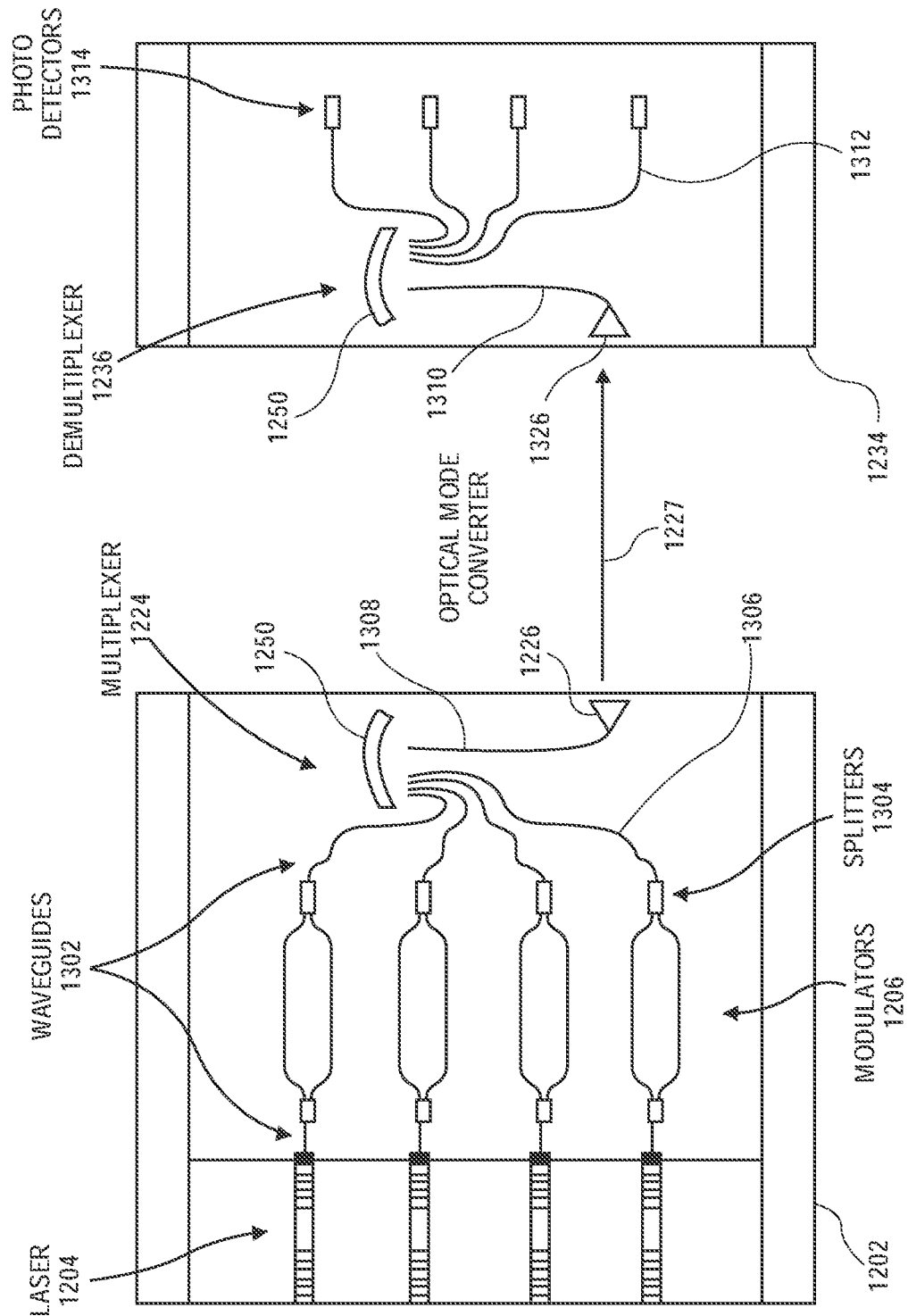
FIG. 13 is an example embodiment of the optoelectronic system as an integrated photonics link.

FIG. 13 is an example embodiment of the optoelectronic system as an integrated photonics link 1300. Similar to the system 1200 described above, the link 1300 may include a transmitter 1202 and receiver 1234. The transmitter 1202 may include multiple lasers 1204 and waveguides 1302 comprising modulators 1206 and splitters 1304. The optical signals generated by the lasers 1204 may be provided through the waveguides 1302 and splitters 1304 to the mirror 1250 of the multiplexer 1224 with multiple input waveguides 1306, according to wavelengths of each of the waveguides 1306. The mirror 1250 may substantially totally reflect the optical signals of different wavelengths and combine the signals due to the echelle grating effect of the mirror. An output waveguide 1308 may receive the combined optical signal and transmit the optical signal to the optical mode converter 1226. The optical mode converter 1226 may provide the optical signal 1227 converted from the combined optical signal to the receiver 1234, to be converted by an optical mode converter 1326 of the receiver 1234. The converted optical signal may then be input into the demultiplexer 1236 with the mirror 1250 via the input waveguide 1310.

Mirror 1250 may substantially totally reflect the optical signal, which may be split by wavelengths due to the echelle grating effect of mirror 1250. The split portions of the signal may be received by multiple output waveguides 1312, according to corresponding wavelengths of the waveguides 1312. The portions of the output signal may be provided via the output waveguides 1312 to photodetectors 1314, to be further processed as desired.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present specification.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

In the foregoing description, certain aspects of some or all embodiments are described in greater detail than is strictly necessary for practicing the appended claims. These details are provided by way of nonlimiting example only, for the purpose of providing context and illustration of the disclosed embodiments. Such details should not be understood to be required, and should not be "read into" the claims as limitations. The phrase may refer to "an embodiment" or "embodiments." These phrases, and any other references to embodiments, should be understood broadly to refer to any combination of one or more embodiments. Furthermore, the several features disclosed in a particular "embodiment" could just as well be spread across multiple embodiments. For example, if features 1 and 2 are disclosed in "an embodiment," embodiment A may have feature 1 but lack feature 2, while embodiment B may have feature 2 but lack feature 1.

This specification may provide illustrations in a block diagram format, wherein certain features are disclosed in separate blocks. These should be understood broadly to disclose how various features interoperate, but are not intended to imply that those features must necessarily be embodied in separate hardware or software. Furthermore, where a single block discloses more than one feature in the same block, those features need not necessarily be embodied in the same hardware and/or software. For example, a computer "memory" could in some circumstances be distributed or mapped between multiple levels of cache or local memory, main memory, battery-backed volatile memory, and various forms of persistent memory such as a hard disk, storage server, optical disk, tape drive, or similar. In certain embodiments, some of the components may be omitted or consolidated. In a general sense, the arrangements depicted in the figures may be more logical in their representations, whereas a physical architecture may include various permutations, combinations, and/or hybrids of these elements. Countless possible design configurations can be used to achieve the operational objectives outlined herein. Accordingly, the associated infrastructure has a myriad of substitute arrangements, design choices, device possibilities, hardware configurations, software implementations, and equipment options.

References may be made herein to a computer-readable medium, which may be a tangible and non-transitory computer-readable medium. As used in this specification and throughout the claims, a "computer-readable medium" should be understood to include one or more computer-readable mediums of the same or different types. A computer-readable medium may include, by way of nonlimiting example, an optical drive (e.g., CD/DVD/Blu-Ray), a hard drive, a solid state drive, a flash memory, or other non-volatile medium. A computer-readable medium could also include a medium such as a ROM, an FPGA or ASIC configured to carry out the desired instructions, stored instructions for programming an FPGA or ASIC to carry out the desired instructions, an intellectual property (IP) block that can be integrated in hardware into other circuits, or instructions encoded directly into hardware or microcode on a processor such as a microprocessor, DSP, microcontroller, or in any other suitable component, device, element, or object where appropriate and based on particular needs. A non-transitory storage medium herein is expressly intended to include any non-transitory special-purpose or programmable hardware configured to provide the disclosed operations, or to cause a processor to perform the disclosed operations.

Various elements may be "communicatively," "electrically," "mechanically," or otherwise "coupled" to one another throughout this specification and the claims. Such coupling may be a direct, point-to-point coupling, or may include intermediary devices. For example, two devices may be communicatively coupled to one another via a controller that facilitates the communication. Devices may be electrically coupled to one another via intermediary devices such as signal boosters, voltage dividers, or buffers. Mechanically coupled devices may be indirectly mechanically coupled.

Any "module" or "engine" disclosed herein may refer to or include software, a software stack, a combination of hardware, firmware, and/or software, a circuit configured to carry out the function of the engine or module, or any computer-readable medium as disclosed above. Such modules or engines may, in appropriate circumstances, be provided on or in conjunction with a hardware platform, which may include hardware compute resources such as a processor, memory, storage, interconnects, networks and network interfaces, accelerators, or other suitable hardware. Such a hardware platform may be provided as a single monolithic device (e.g., in a PC form factor), or with some or part of the function being distributed (e.g., a "composite node" in a high-end data center, where compute, memory, storage, and other resources may be dynamically allocated and need not be local to one another).

There may be disclosed herein flow charts, signal flow diagram, or other illustrations showing operations being performed in a particular order. Unless otherwise expressly noted, or unless required in a particular context, the order should be understood to be a nonlimiting example only. Furthermore, in cases where one operation is shown to follow another, other intervening operations may also occur, which may be related or unrelated. Some operations may also be performed simultaneously or in parallel. In cases where an operation is said to be "based on" or "according to" another item or operation, this should be understood to imply that the operation is based at least partly on or according at least partly to the other item or operation. This should not be construed to imply that the operation is based solely or exclusively on, or solely or exclusively according to the item or operation.

All or part of any hardware element disclosed herein may readily be provided in an SoC, including a CPU package. An SoC represents an integrated circuit (IC) that integrates components of a computer or other electronic system into a single chip. Thus, for example, client devices or server devices may be provided, in whole or in part, in an SoC. The SoC may contain digital, analog, mixed-signal, and radio frequency functions, all of which may be provided on a single chip substrate. Other embodiments may include a multichip module (MCM), with a plurality of chips located within a single electronic package and configured to interact closely with each other through the electronic package.

In a general sense, any suitably-configured circuit or processor can execute any type of instructions associated with the data to achieve the operations detailed herein. Any processor disclosed herein could transform an element or an article (for example, data) from one state or thing to another state or thing. Furthermore, the information being tracked, sent, received, or stored in a processor could be provided in any database, register, table, cache, queue, control list, or storage structure, based on particular needs and implementations, all of which could be referenced in any suitable timeframe. Any of the memory or storage elements disclosed herein, should be construed as being encompassed within the broad terms "memory" and "storage," as appropriate.

Computer program logic implementing all or part of the functionality described herein is embodied in various forms, including, but in no way limited to, a source code form, a computer executable form, machine instructions or microcode, programmable hardware, and various intermediate forms (for example, forms generated by an assembler, compiler, linker, or locator). In an example, source code includes a series of computer program instructions implemented in various programming languages, such as an object code, an assembly language, or a high level language such as OpenCL, FORTRAN, C, C++, JAVA, or HTML for use with various operating systems or operating environments, or in hardware description languages such as Spice, Verilog, and VHDL. The source code may define and use various data structures and communication messages. The source code may be in a computer executable form (e.g., via an interpreter), or the source code may be converted (e.g., via a translator, assembler, or compiler) into a computer executable form, or converted to an intermediate form such as byte code. Where appropriate, any of the foregoing may be used to build or describe appropriate discrete or integrated circuits, whether sequential, combinatorial, state machines, or otherwise.

In one example embodiment, any number of electrical circuits of the FIGURES may be implemented on a board of an associated electronic device. The board can be a general circuit board that can hold various components of the internal electronic system of the electronic device and, further, provide connectors for other peripherals. Any suitable processor and memory can be suitably coupled to the board based on particular configuration needs, processing demands, and computing designs. Note that with the numerous examples provided herein, interaction may be described in terms of two, three, four, or more electrical components. However, this has been done for purposes of clarity and example only. It should be appreciated that the system can be consolidated or reconfigured in any suitable manner. Along similar design alternatives, any of the illustrated components, modules, and elements of the FIGURES may be combined in various possible configurations, all of which are within the broad scope of this specification.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 (pre-AIA) or paragraph (f) of the same section (post-AIA), as it exists on the date of the filing hereof unless the words "means for" or "steps for" are specifically used in the particular claims; and (b) does not intend, by any statement in the specification, to limit this disclosure in any way that is not otherwise expressly reflected in the appended claims.

Example Implementations

The following examples are provided by way of illustration.

Example 1 includes a fiberoptic communication device, comprising: a modulator to modulate data onto a laser pulse; and a semiconductor laser source comprising an active optical waveguide to provide optical gain and support an optical mode, the laser source further comprising a V-shaped current channel superimposed on the optical waveguide, and disposed to feed the active optical waveguide with electrical current along its length, the current channel having a proximate end to the optical mode, the proximate end having a width substantially matching a diameter of the optical mode, and a removed end from the optical mode, wherein the removed end is substantially wider than the proximate end.

Example 2 includes the fiberoptic communication device of example 1, wherein the proximate end and removed end have an angle between their edges of greater than 20 degrees.

Example 3 includes the fiberoptic communication device of example 1, wherein the proximate end has a width of between 2 and 3 units, and the removed end has a width of greater than 4 units.

Example 4 includes the fiberoptic communication device of example 3, wherein the unit is micrometers.

Example 5 includes the fiberoptic communication device of examples 1-4, wherein the laser source is a III-V silicon hybrid laser source.

Example 6 includes the fiberoptic communication device of examples 1-4, wherein the laser comprises a P-channel at the removed end, an N-channel at the proximate end, and a conductive layer at the proximate end.

Example 7 includes the fiberoptic communication device of examples 1-4, further comprising a conductive layer above the removed end, wherein contact surface area between the current channel and the conductive layer is larger relative to a current channel having substantially vertical walls, whereby contact resistance between the current channel and the conductive layer is reduced.

Example 8 includes the fiberoptic communication device of example 7, wherein the conductive layer is a heavily-doped indium gallium arsenide layer.

Example 9 includes the fiberoptic communication device of examples 1-8, wherein the V-shaped current channel has a re-entrant angle of between 20 degrees and 30 degrees from vertical.

Example 10 includes an integrated circuit, comprising fabricated logic elements on a semiconductor substrate, the logic elements comprising: a fiberoptic communication driver comprising a modulator to modulate data onto a light source, and a semiconductor laser to provide the light source, the laser comprising an optical waveguide to support an optical mode, the laser source further comprising a V-shaped current channel superimposed on the optical waveguide, and placed to provide electrical current along the length of the waveguide, the current channel having a proximate end to the optical mode, the proximate end having a width substantially matching a diameter of the optical mode, and a removed end substantially wider than the proximate end.

Example 11 includes the integrated circuit of example 10, wherein the non-vertical sidewalls have an angle of greater than 20 degrees from vertical.

Example 12 includes the integrated circuit of example 10, wherein the non-vertical sidewalls have an angle of between approximately 20 and approximately 30 degrees from vertical.

Example 13 includes the integrated circuit of example 10, wherein the proximate end has a width of between 2 and 3 units, and a removed end from the optical mode has a width of greater than 4 units.

Example 14 includes the integrated circuit of example 13, wherein the unit is micrometers.

Example 15 includes the integrated circuit of examples 10-14, wherein the laser provides a III-V hybrid laser source.

Example 16 includes the integrated circuit of examples 10-14, wherein the laser comprises a P-channel at a removed end from the optical mode, an N-channel at the proximate end, and a conductive layer at the proximate end.

Example 17 includes the integrated circuit of example 16, further comprising a conductive layer above the removed end, wherein contact surface area between the current channel and the conductive layer is larger relative to a current channel having substantially vertical walls, whereby contact resistance between the current channel and the conductive layer is reduced.

Example 18 includes the integrated circuit of example 17, wherein the conductive layer is a heavily-doped indium gallium arsenide layer.

Example 19 includes a method of manufacturing a fiberoptic communication circuit, comprising: disposing a photo-resist mask over a substrate, the photo-resist mask having substantially an inverted isosceles trapezoid shape with a re-entrant angle of between 20 and 30 degrees; performing a first proton bombardment at a first angle to pass a first side of the inverted trapezoid; and performing a second proton bombardment at a second angle to pass a second side of the inverted trapezoid; whereby a V-shaped non-bombarded current channel region is defined within the substrate.

Example 20 includes the method of example 19, further comprising depositing a conductive layer over the current channel region.

What is claimed is:

1. A fiberoptic communication device, comprising:
   a modulator to modulate data onto a laser pulse; and
   a silicon photonics laser source comprising an active optical waveguide to provide optical gain and support an optical mode, the laser source further comprising a V-shaped current channel superimposed on the optical waveguide, and disposed to feed the active optical waveguide with electrical current along its length, the current channel having a proximate end to the optical mode, the proximate end having a width substantially matching a diameter of the optical mode, and a removed end from the optical mode, wherein the removed end is substantially wider than the proximate end;
   wherein the proximate end and removed end have an angle between their edges of between approximately 20 to 30 degrees.

2. The fiberoptic communication device of claim 1, wherein the proximate end has a width of between 2 and 3 units, and the removed end has a width of greater than 4 units.

3. The fiberoptic communication device of claim 2, wherein the units are micrometers.

4. The fiberoptic communication device of claim 1, wherein the laser source is a III-V silicon hybrid laser source.

5. The fiberoptic communication device of claim 1, wherein the laser source comprises a P-channel at the removed end, an N-channel at the proximate end, and a conductive layer at the proximate end.

6. The fiberoptic communication device of claim 1, further comprising a conductive layer above the removed end, wherein contact surface area between the current channel and the conductive layer is larger relative to a current channel having substantially vertical walls, whereby contact resistance between the current channel and the conductive layer is reduced.

7. The fiberoptic communication device of claim 6, wherein the conductive layer is a heavily-doped indium gallium arsenide layer.

8. The fiberoptic communication device of claim 1, wherein the V-shaped current channel has a re-entrant angle of between 20 degrees and 30 degrees from vertical.

9. An integrated circuit, comprising fabricated logic elements on a semiconductor substrate, the logic elements comprising:
   a silicon photonics communication driver comprising a modulator to modulate data onto a light source, and a semiconductor laser to provide the light source, the laser comprising an optical waveguide to support an optical mode, the light source further comprising a V-shaped current channel superimposed on the optical waveguide, and placed to provide electrical current along a length of the waveguide, the current channel having a proximate end to the optical mode, the proximate end having a width substantially matching a diameter of the optical mode, and a removed end substantially wider than the proximate end;
   wherein the waveguide comprises non-vertical sidewalls having an angle of greater than 20 degrees from vertical.

10. The integrated circuit of claim 9, wherein the non-vertical sidewalls having an angle of between approximately 20 and approximately 30 degrees from vertical.

11. The integrated circuit of claim 9, wherein the proximate end has a width of between 2 and 3 units, and a removed end from the optical mode has a width of greater than 4 units.

12. The integrated circuit of claim 11, wherein the units are micrometers.

13. The integrated circuit of claim 9, wherein the laser provides a III-V silicon hybrid laser source.

14. The integrated circuit of claim 9, wherein the laser comprises a P-channel at a removed end from the optical mode, an N-channel at the proximate end, and a conductive layer at the proximate end.

15. The integrated circuit of claim 14, further comprising a conductive layer above the removed end, wherein contact surface area between the current channel and the conductive layer is larger relative to a current channel having substantially vertical walls, whereby contact resistance between the current channel and the conductive layer is reduced.

16. The integrated circuit of claim 15, wherein the conductive layer is a heavily-doped indium gallium arsenide layer.

17. A rackmount network switch for a data center, comprising:
   a receiver; and
   a transmitter, the transmitter comprising a modulator to modulate data onto a silicon photonics laser source, the silicon photonics laser source comprising an optical waveguide having a V-shaped current channel disposed to provide an electrical current along a transverse dimension of the waveguide, the current channel having a proximate end to an optical mode, the proximate end having a width substantially matching a diameter of the optical mode, wherein the V-shaped current channel expands out from the proximate end to a removed end substantially wider than the proximate end, wherein the V-shaped current channel has an angle of between approximately 20 to 30 degrees from vertical.

18. The rackmount network switch of claim 17, wherein the transmitter is a multimode transmitter.

\* \* \* \* \*